United States Patent
Ku et al.

(10) Patent No.: US 11,078,082 B2
(45) Date of Patent: Aug. 3, 2021

(54) METHOD OF FABRICATING GRAPHENE STRUCTURE HAVING NANOBUBBLES

(71) Applicant: Samsung Electronics Co., Ltd., Suwon-si (KR)

(72) Inventors: Jiyeon Ku, Suwon-si (KR); Wonhee Ko, Seoul (KR); Hyowon Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 29 days.

(21) Appl. No.: 16/267,491

(22) Filed: Feb. 5, 2019

(65) Prior Publication Data
US 2019/0169031 A1  Jun. 6, 2019

Related U.S. Application Data

(62) Division of application No. 14/928,957, filed on Oct. 30, 2015, now abandoned.

(30) Foreign Application Priority Data

Oct. 31, 2014 (KR) .................. 10-2014-0150629

(51) Int. Cl.
  *C23C 16/26*  (2006.01)
  *C23C 16/455*  (2006.01)
  *C01B 32/194*  (2017.01)
  *H01L 21/02*  (2006.01)

(52) U.S. Cl.
  CPC ........ *C01B 32/194* (2017.08); *H01L 21/0262* (2013.01); *H01L 21/02422* (2013.01);
  (Continued)

(58) Field of Classification Search
  CPC ........ C23C 16/45536; C23C 16/45553; C23C 16/0245; C23C 16/46; C23C 16/26
  See application file for complete search history.

(56) References Cited

U.S. PATENT DOCUMENTS

| | | |
|---|---|---|
| 8,105,928 B2 | 1/2012 | Lin et al. |
| 8,450,198 B2 | 5/2013 | Lin et al. |

(Continued)

FOREIGN PATENT DOCUMENTS

| | | |
|---|---|---|
| JP | 2010-021377 A | 1/2010 |
| JP | 2014-065617 A | 4/2014 |

(Continued)

OTHER PUBLICATIONS

Kim, Songkil, et al., "Multi-purposed Ar gas cluster ion beam processing for graphene engineering". Carbon 131 (2018) 142-148.*

(Continued)

*Primary Examiner* — Bret P Chen
(74) *Attorney, Agent, or Firm* — Harness, Dickey & Pierce, P.L.C.

(57) ABSTRACT

Example embodiments relate to a method of manufacturing graphene structures having nanobubbles. The graphene structure includes a graphene layer on a substrate, the graphene layer having a plurality of convex portions and a band gap that is due to the plurality of convex portions. The method includes preparing the graphene layer on the substrate, and forming the plurality of convex portions on the graphene layer by irradiating a noble gas onto the graphene layer.

8 Claims, 5 Drawing Sheets

(52) U.S. Cl.
CPC .. *H01L 21/02425* (2013.01); *H01L 21/02433* (2013.01); *H01L 21/02527* (2013.01); *H01L 21/02587* (2013.01); *H01L 21/02664* (2013.01); *C01B 2204/02* (2013.01); *C01B 2204/22* (2013.01); *C23C 16/26* (2013.01)

(56) References Cited

U.S. PATENT DOCUMENTS

| | | | | |
|---|---|---|---|---|
| 2005/0127334 | A1* | 6/2005 | Shibata | H01J 1/304 252/502 |
| 2007/0102111 | A1* | 5/2007 | Monsma | C01B 32/168 156/296 |
| 2009/0029041 | A1* | 1/2009 | Natsume | C11D 11/0047 427/129 |
| 2009/0306765 | A1* | 12/2009 | Weber | A61L 31/022 623/1.15 |
| 2011/0083713 | A1* | 4/2011 | Narducci | H01L 35/32 136/230 |
| 2011/0092054 | A1* | 4/2011 | Seo | H01L 29/78684 438/473 |
| 2011/0104442 | A1* | 5/2011 | Yoon | B82Y 30/00 428/152 |
| 2011/0108805 | A1 | 5/2011 | Okai | |
| 2012/0258587 | A1* | 10/2012 | Kub | H01L 29/78684 438/610 |
| 2014/0030857 | A1* | 1/2014 | Lee | C01B 32/186 438/158 |
| 2014/0079936 | A1 | 3/2014 | Russo et al. | |
| 2014/0080295 | A1 | 3/2014 | Baldwin et al. | |
| 2014/0158914 | A1* | 6/2014 | Klebanoff | G02B 27/0006 250/492.2 |
| 2014/0227548 | A1* | 8/2014 | Myrick | C10L 1/28 428/570 |
| 2015/0079399 | A1* | 3/2015 | Huyghebaert | B32B 37/025 428/408 |
| 2016/0039679 | A1* | 2/2016 | Krishnan | B01J 19/10 516/32 |
| 2016/0122189 | A1* | 5/2016 | Ku | H01L 21/02433 428/166 |
| 2017/0050853 | A1* | 2/2017 | Fray | C25B 11/14 |

FOREIGN PATENT DOCUMENTS

| | | |
|---|---|---|
| KR | 10-2010-0030568 A | 3/2010 |
| KR | 10-2011-0081519 A | 7/2011 |
| KR | 10-2012-0084840 A | 7/2012 |
| KR | 10-2013-0020351 A | 2/2013 |
| KR | 10-2013-0050168 A | 5/2013 |
| KR | 10-2013-0050169 A | 5/2013 |
| KR | 10-2014-0017399 A | 2/2014 |
| KR | 10-2014-0022837 A | 2/2014 |
| WO | WO 2012/125770 A2 * | 9/2012 ............... B81C 1/00 |
| WO | WO-2012/174040 A1 | 12/2012 |

OTHER PUBLICATIONS

Tyler, Bonnie J., et al., "Removal of Organic Contamination from Graphene with a Controllable Mass-Selected Argon Gas Cluster Ion Beam". J. Phys. Chem. C 2015, 119, 17836-17841. https://doi.org/10.1021/acs.jpcc.5b03144.*

Yang, Xichao, et al, "Layer-by-layer thinning of graphene by plasma irradiation and post-annealing". Nanotechnology (2012) 23 025704, pp. 1-6.*

Abdol, Mohammad Ali, et al., "Constructing a three-dimensional graphene structure via bonding layers by ion beam irradiation". Scientific Reports (2019) 9:8127, pp. 1-11, https://doi.org/10.1038/s41598-019-44697-z.*

Levy, N., et al., "Strain-Induced Pseudo-Magnetic Fields Greater Than 300 Tesla in Graphene Nanobubbles". Science, vol. 329, Issue 5991, Jul. 30, 2010, pp. 544-547. DOI: 10.1126/science.1191700.*

Gao, Libo, et al., "Repeated growth and bubbling transfer of graphene with millimetre-size single-crystal grains using platinum". Nature Communications (2012) 3:699, pp. 1-7.*

Dollekamp, Edwin, et al., "Electrochemically Induced Nanobubbles between Graphene and Mica". Langmuir 2016, 32, 6582-6590.*

Jain, Sandeep K., et al., "Probing the Shape of a Graphene Nanobubble". Physical Chemistry Chemical Physics, Feb. 2017, pp. 1-19.*

Langle, Manuel, et al., "2D Noble Gas Crystals Encapsulated in Few-layer Graphene". Microsc. Microanal. 26 (Suppl 2), 2020, pp. 1086-1089.*

Hu, Kailong, et al., "Catalytic activity of graphene-covered non-noble metals governed by proton penetration in electrochemical hydrogen evolution reaction". Nature Communications (2021) 12:203, pp. 1-9.*

Lee, H Cheun, et al., "Review of the synthesis, transfer, characterization and growth mechanisms of single and multilayer graphene". RSC Adv., 2017, 7, 15644-15693.*

Young-Woo Son et al., "Energy Gaps in Graphene Nanoribbons", Physical Review Letters, Nov. 24, 2006, The American Physical Society no page numbers.

Thomas G. Pedersen et al., "Graphene Antidot Lattices: Designed Defects and Spin Qubits", Physical Review Letters, Apr. 4, 2008, The American Physcial Society no page numbers.

Woo Jong Yu et al., "Tunable transport gap in narrow bilayer graphene nanoribbons", Scientific Reports, Feb. 13, 2013 no page numbers.

Philipp Wagner et al., "Band Gap Engineering via Edge-Functionalization of Graphene Nanoribbons", The Journal of Physcial Chemistry, Dec. 2, 2013, American Chemical Society no page numbers.

S.Y. Zhou et al., "Substrate-induced bandgap opening in epitaxial graphene" Nature Materials, vol. 6, Sep. 9, 2007, Nature Publishing Group no page numbers.

N. Levy et al., "Strain-Induced Pseudo-Magnetic Fields Greater Than 300 Tesla in Graphene Nanobubbles", Jul. 30, 2010 vol. 329 sciencemag.org no page numbers.

Yuanbo Zhang et al., "Giant phonon-induced conductance in scanning tunnelling spectroscopy of gate-tunable graphene", nature physics, Jul. 20, 2008, vol. 4 no page numbers.

"Nanoscale control of phonon excitations in graphene" by Hyo Won Kim et al, Nature Communications, published Jun. 25, 2015 no page numbers.

"Highly p-doped epitaxial graphene obtained by fluorine intercalation" by Walter et al. (2011). Published by Applied Physics Letters 98, 184102, 3 pages. (Year: 2011).

Office Action for Korean Application No. 10-2014-0150629 dated Nov. 23, 2020.

* cited by examiner

METHOD OF FABRICATING GRAPHENE STRUCTURE HAVING NANOBUBBLES

RELATED APPLICATION

This application is a divisional of, and claims priority under 35 U.S.C. § 120 to, U.S. application Ser. No. 14/928,957, filed Oct. 30, 2015 (abandoned), which claims the benefit of priority from Korean Patent Application No. 10-2014-0150629, filed on Oct. 31, 2014, in the Korean Intellectual Property Office, the disclosure of which is incorporated herein in its entirety by reference.

BACKGROUND

1. Field

Example embodiments relate to graphene structures having nanobubbles and/or methods of fabricating the graphene structures.

2. Description of the Related Art

Graphene having a 2-dimensional hexagonal carbon structure is a new material that can replace semiconductor. The graphene is typically a zero gap semiconductor. However, a graphene nanoribbon (GNR) having a width of 10 nm or less may have a band gap due to size effect, and accordingly, a field effect transistor that can be operated at room temperature can be manufactured by using GNR.

However, when the GNR is manufactured, an ON/OFF ratio of graphene is improved but mobility may be reduced due to disordered edges, and on-current may be small. As a solution to these problems, a band gap may be formed by applying a field effect in a vertical direction to a bi-layered graphene. However, this method may not be suitable for growing graphene having a uniform double structure, and may be difficult for practical use due to random domain.

SUMMARY

Example embodiments relate to graphene structures that form a band gap by using graphene having nanobubbles instead of graphene nanoribbon (GNR).

Example embodiments relate to methods of manufacturing the graphene structures.

Additional example embodiments will be set forth in part in the description which follows and, in part, will be apparent from the description, or may be learned by practice of the example embodiments.

According to an example embodiment, a graphene structure includes a substrate and a graphene layer on the substrate, the graphene layer having a plurality of convex portions, wherein each of the plurality of convex portions has a hollow structure, and the graphene layer has a band gap due to the convex portions.

The graphene layer may be substantially a mono layer.

The convex portions may have a diameter in a range from about 2 nm to about 6 nm, and a height in a range of about 0.15 nm to about 1 nm.

The substrate may be formed of or include a catalyst metal that may be used for growing the graphene layer.

The graphene structure may include a noble gas between the substrate and the convex portions.

The noble gas may include argon (Ar) ion gas, helium (He) ion gas, neon (Ne) ion gas, krypton (Kr) ion gas, xenon (Xe) ion gas, or radon (Rn) ion gas.

According to an example embodiment, a method of manufacturing a graphene structure includes preparing a graphene layer on a substrate and forming a plurality of convex portions on the graphene layer by irradiating a noble gas onto the graphene layer.

Preparing the graphene layer may include preparing a catalyst substrate and growing the graphene layer on the substrate by supplying a carbon source gas on the catalyst substrate.

Preparing the graphene layer may include transferring the graphene layer on the substrate.

Irradiating a noble gas may be or include sputtering the noble gas.

BRIEF DESCRIPTION OF THE DRAWINGS

These and/or other example embodiments will become apparent and more readily appreciated from the following description, taken in conjunction with the accompanying drawings in which.

DETAILED DESCRIPTION

Figure 1:
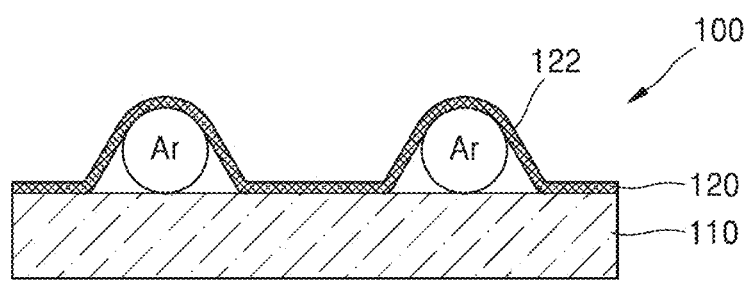
FIG. 1 is a schematic cross-sectional view of a graphene structure having nanobubbles, according to at least one example embodiment.

Reference will now be made in detail to example embodiments illustrated in the accompanying drawings. In the drawings, the thicknesses of layers and regions are exaggerated for clarity. The example embodiments are capable of various modifications and may be embodied in many different forms. Like reference numerals in the drawings denote like elements throughout the specification, and thus their description will be omitted. In the drawing figures, the dimensions of layers and regions may be exaggerated for clarity of illustration. Like reference numerals refer to like elements throughout. The same reference numbers indicate the same components throughout the specification.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

FIG. 1 is a schematic cross-sectional view of a graphene structure 100 having nanobubbles, according to an example embodiment.

Referring to FIG. 1, the graphene structure 100 having nanobubbles 122 includes a graphene layer 120 formed on a substrate 110. The substrate 110 may be formed of or include Pt having a (111) surface. The graphene layer 120 may be formed by supplying a carbon source gas on a Pt substrate as a catalyst.

However, the example embodiment is not limited thereto. The substrate 110 may be an insulating substrate. For example, the substrate 110 may include a silicon substrate and a silicon oxide layer on the silicon substrate. When an insulating substrate is used as the substrate 110, the graphene layer 120 may be disposed on the substrate 110 by transferring the graphene layer 120.

The graphene layer 120 may include a plurality of convex portions 122. In FIG. 1, for convenience, two convex portions 122 are depicted. Each of the convex portions 122 may have a nano size. Hereinafter, the convex portions 122 are referred to as nanobubbles 122. The nanobubbles 122 may be formed by irradiating a noble gas, such as Ar ions, on the graphene layer 120. The noble gas may include Ar ions, Ar atoms, etc. The irradiation of Ar ions may be performed via, for example, a sputtering method.

Ar ions having a predetermined energy are intercalated between the substrate 110 and the graphene layer 120 by penetrating through the graphene layer 120. Regions of the graphene layer 120 where the Ar ions are intercalated form the convex portions 122 (nanobubbles 122) because of the volume of Ar ions. Ar ions in the nanobubbles 122 may exist as Ar atoms by doping the graphene layer 120.

At least one Ar ion may exist in each of the nanobubbles 122. The Ar ion may dope the graphene layer 120 and may be transformed into an Ar atom as a result.

The example embodiments are not limited thereto. For example, instead of Ar ion gas, helium (He) ion gas, neon (Ne) ion gas, krypton (Kr) ion gas, xenon (Xe) ion gas, radon (Rn) ion gas may be used.

Figure 2:
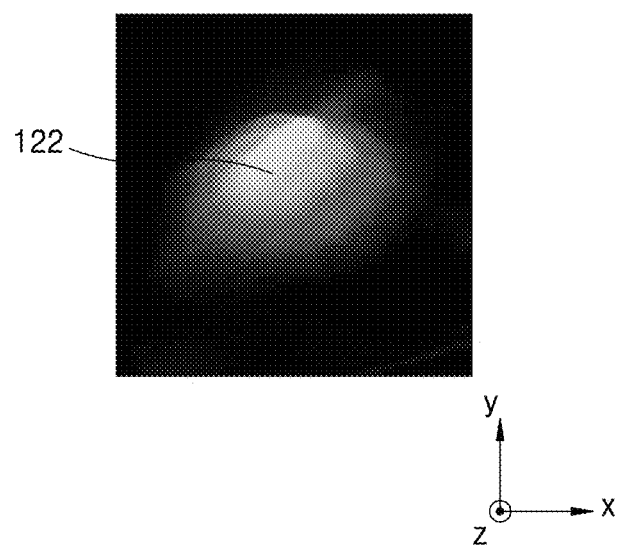
FIG. 2 is a photograph of a scanning tunneling microscope (STM) showing a graphene structure having nanobubbles, according to at least one example embodiment.

FIG. 2 is a photograph of a scanning tunneling microscope (STM) photograph showing a graphene structure having nanobubbles 122 according to an example embodiment. The STM photograph has a dimension of 3.0 nm×3.0 nm.

As shown in FIG. 2, a convex portion (the nanobubble 122) having a nano size protrudes upward, which is a z direction as illustrated in the figure.

Figure 3:
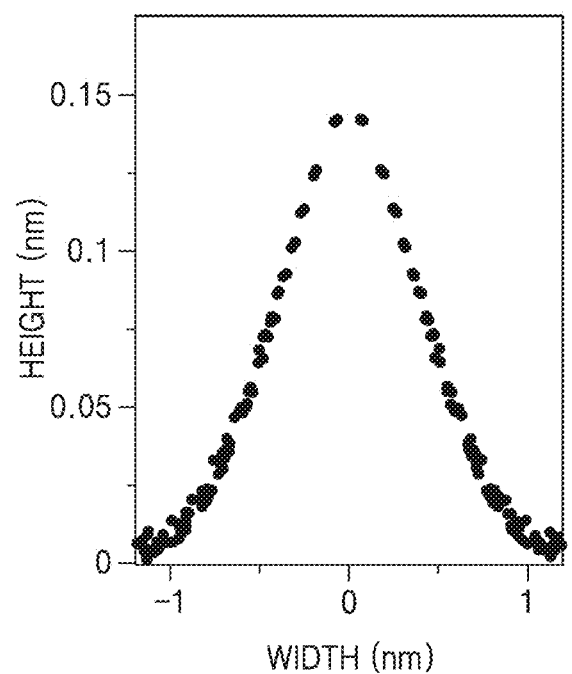
FIG. 3 is a graph illustrating a size of nanobubbles in which a single Ar ion is formed.

FIG. 3 is a graph showing a size of a nanobubble 122 in which a single Ar ion is intercalated. FIG. 3 illustrated this result via a density functional theory (DFT) calculation.

Referring to FIG. 3, the nanobubble having a single Ar ion has a diameter of approximately 2 nm and a height of approximately 0.15 nm.

Figure 4:
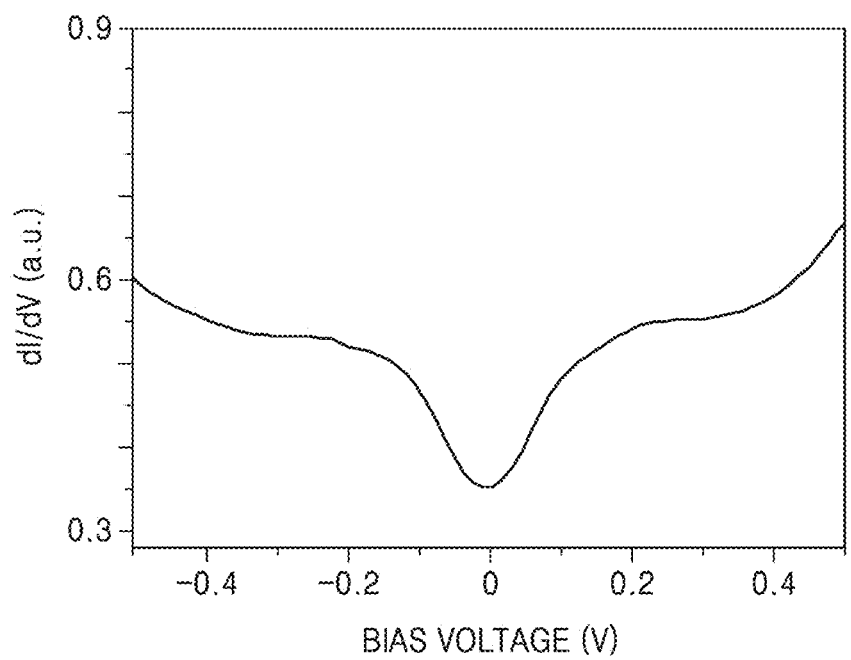
FIG. 4 is a graph showing a differential conductance of nanobubbles.

FIG. 4 is a graph showing a differential conductance of the nanobubble. The differential conductance is measured via scanning tunneling spectroscopy (STS).

Referring to FIG. 4, the differential conductance of the nanobubble is changed according to a bias voltage. As a result, the nanobubble has a peak near a Dirac point, and has a similar characteristic to a band gap.

Hereinafter, a method of manufacturing the graphene structure 100 according to another example embodiment will be described with reference to FIG. 1.

First, a substrate 110 is prepared. In the example embodiment, a Pt substrate having a (111) surface is used as the substrate 110. However, the example embodiment is not limited thereto. For example, an insulating substrate in which a silicon oxide layer is formed on a silicon substrate may be used. Also, a plastic substrate may be used.

When the substrate 110 formed of or including Pt which is a catalyst material is used, graphene is grown by supplying a carbon source gas, for example, an ethylene gas onto the substrate 110. The graphene layer 120 may be grown at a temperature of approximately 400° C. for approximately 10 minutes. Thus, the graphene layer 120 may be formed on the substrate 110. The graphene layer 120 may have a structure of one layer or more according to the amount of the carbon source gas that is supplied onto the substrate 110 and the supplying time. In the example embodiment, the graphene layer 120 has one layer.

However, the example embodiment is not limited thereto. The graphene layer 120 may be formed by transferring the graphene layer 120 on the substrate 110.

According to at least one example embodiment, Ar ions are irradiated onto the graphene layer 120. The Ar irradiation may be performed via, for example, a sputtering method. Ar ions may be supplied with a power of 500 eV and a current of 1 μA. Ar ions are intercalated between the substrate 110 and the graphene layer 120 by penetrating through the graphene layer 120. As a result, a plurality of convex portions (nanobubbles 122) are formed the graphene layer 120. Ar ions in the nanobubbles 122 may dope the graphene layer 120, and as a result may become Ar atoms.

In the example embodiment, Ar ions are used as a noble gas. However, the noble gas according to the example embodiment is not limited thereto. For example, instead of Ar ion gas, helium (He) ion gas, neon (Ne) ion gas, krypton (Kr) ion gas, xenon (Xe) ion gas, and radon (Rn) ion gas or another noble gas may be used as the noble gas.

Figure 5:
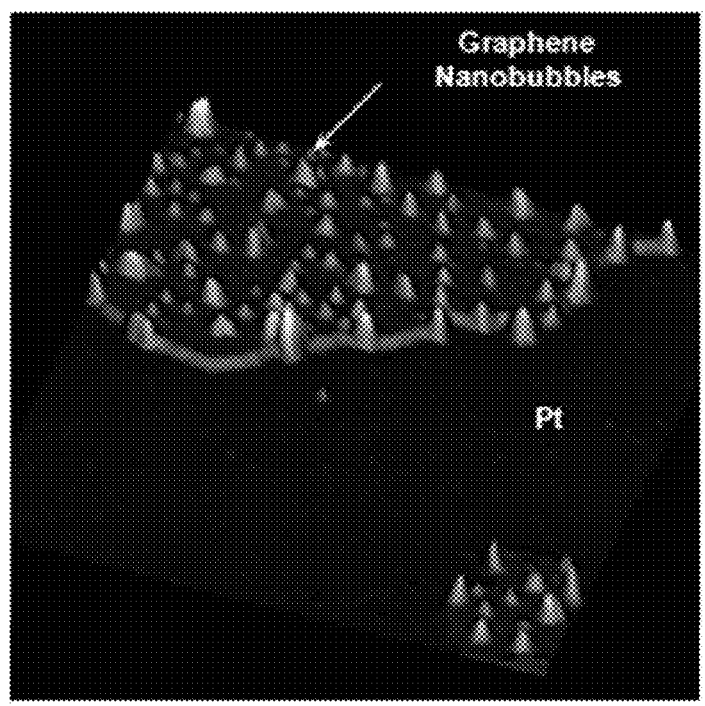
FIG. 5 is an STM photograph showing a graphene structure having a plurality of nanobubbles, according to at least one example embodiment.

FIG. 5 is an STM picture showing a graphene structure having a plurality of nanobubbles, according to another example embodiment. The example graphene structure of FIG. 5 has a dimension of 25 nm×25 nm.

Referring to FIG. 5, two graphene islands may be formed on a (111) Pt substrate. A plurality of nanobubbles may be formed in each island. At least one Ar ion may be present between each of the nanobubbles and the substrate.

Figure 6:
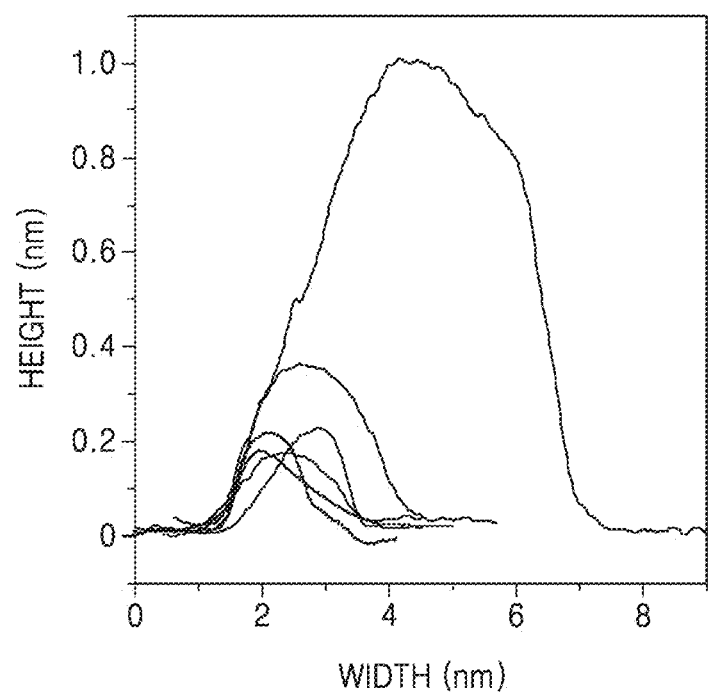
FIG. 6 is a graph showing sizes of nanobubbles

FIG. 6 is a graph showing sizes of nanobubbles of FIG. 5. According to at least one example embodiment, nanobubbles have a diameter in a range from about 2 nm to about 6 nm and a height in a range from about 0.15 nm to about 1 nm. The size of nanobubbles may vary according to the number of Ar ions (or Ar atoms) that exist in the nanobubbles. As the number of nanobubbles increases, the size of the nanobubbles increases.

In the graphene structure having nanobubbles according to an example embodiment, Ar ions penetrate through the graphene layer, and thus, a nanobubble structure is formed as a result. Accordingly, the graphene layer having the nanobubbles may have a band gap. In the example embodiment, since a band gap is formed in graphene due to a size effect without using GNR as in the conventional art, the graphene may be used in any graphene device that requires graphene having a band gap.

While one or more example embodiments have been described with reference to the figures, it will be understood by those of ordinary skill in the art that various changes in form and details may be made therein without departing from the spirit and scope as defined by the following claims.

What is claimed is:

1. A method of manufacturing a graphene structure, the method comprising:
preparing a graphene layer on a substrate; and
penetrating noble gas ions through the graphene layer such that the noble gas ions remain between the graphene layer and the substrate forming at least one nanobubble.

2. The method of claim 1, wherein the preparing of the graphene layer comprises:
preparing a catalyst substrate; and
growing the graphene layer on the substrate by supplying a carbon source gas on the catalyst substrate.

3. The method of claim 1, wherein the preparing of the graphene layer comprises transferring the graphene layer on the substrate.

4. The method of claim 1, wherein the noble gas is Ar gas.

5. The method of claim 1,
wherein the penetrating the noble gas ions through the graphene layer comprises sputtering the noble gas ions, and
wherein the sputtering forms at least one noble gas ion between the substrate and the graphene layer to form the at least one nanobubble.

6. The method of claim 1, wherein each of the at least one nanobubble has a diameter in a range from about 2 nm to about 6 nm, and a height in a range from about 0.15 nm to about 1 nm.

7. The method of claim 1, wherein the penetrating the noble gas ions through the graphene layer comprises:
irradiating the noble gas ions via a sputtering method.

8. The method of claim 7, wherein the penetrating the noble gas ions through the graphene layer comprises:
supplying the noble gas ions with a power of 500 eV and a current of 1 μA.

* * * * *